United States Patent [19]

Rozanski, Jr.

[11] Patent Number: 4,776,037
[45] Date of Patent: Oct. 4, 1988

[54] METHOD AND APPARATUS FOR PROVIDING PRIORITY CHANNEL SCAN IN A RADIO

[75] Inventor: Walter J. Rozanski, Jr., Hurst, Tex.

[73] Assignee: Motorola, Inc., Schaumburg, Ill.

[21] Appl. No.: 82,719

[22] Filed: Aug. 3, 1987

[51] Int. Cl.⁴ .............................................. H04B 7/26
[52] U.S. Cl. ................................... 455/166; 455/185; 340/825.44
[58] Field of Search ................... 455/166, 58, 35, 38, 455/185, 186; 340/825.04, 825.44, 825.5, 825.51, 825.1

[56] References Cited

U.S. PATENT DOCUMENTS

| | | | |
|---|---|---|---|
| 3,585,598 | 6/1971 | Hudson, Jr. et al. | 455/166 X |
| 3,750,032 | 7/1973 | Andrews | 455/166 X |
| 4,499,601 | 2/1985 | Matthews | 455/166 |
| 4,636,791 | 1/1987 | Burke et al. | 340/825.44 X |
| 4,716,407 | 12/1987 | Borras et al. | 455/166 X |

Primary Examiner—Theodore M. Blum
Assistant Examiner—Gilberto Barrón, Jr.
Attorney, Agent, or Firm—Steven G. Parmelee

[57] ABSTRACT

A priority channel scan for use in radios capable for receiving at least two channels, wherein one of the channels is a priority communications channel. The radio periodically interrupts communications on the non-priority channel for very brief moments to allow monitoring of the priority channel for the presence of digital code word segments. These digital code word segments are stored until the complete code word can be reconstructed and compared against stored code words. When a match occurs, the radio switches to the priority channel to allow reception of a priority message occurring thereon.

7 Claims, 2 Drawing Sheets

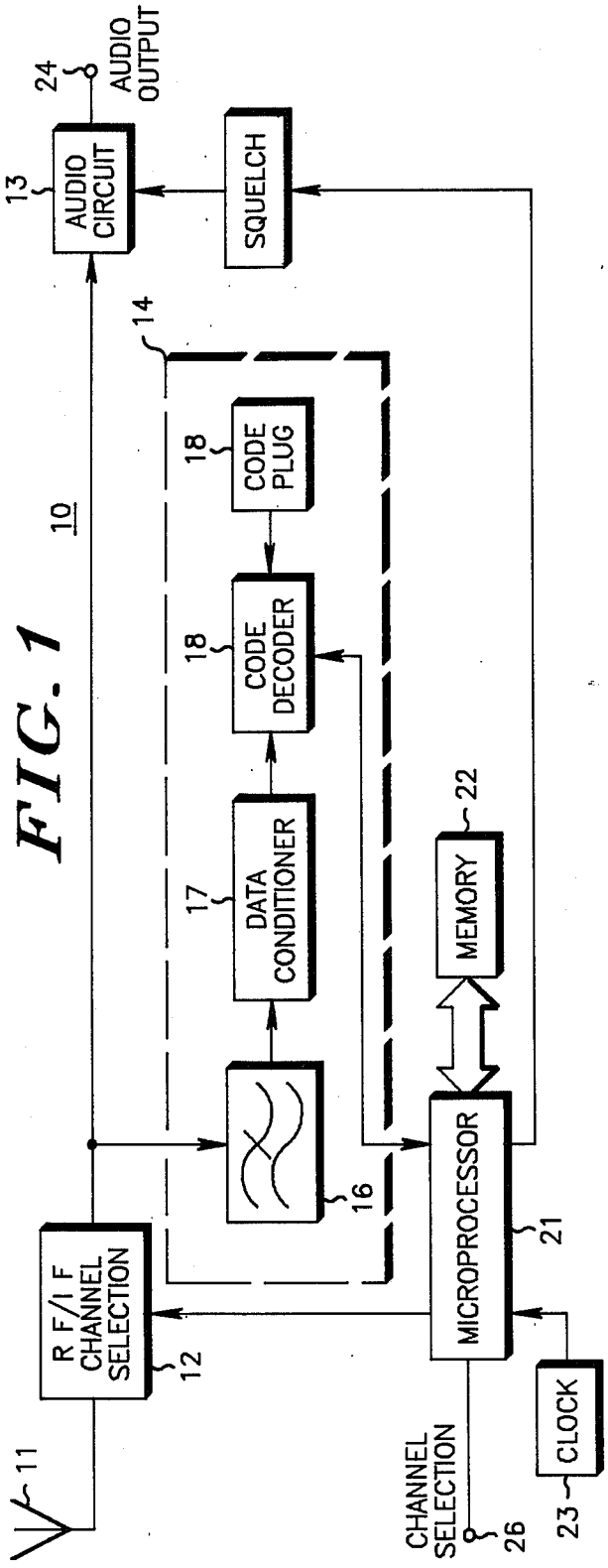

METHOD AND APPARATUS FOR PROVIDING PRIORITY CHANNEL SCAN IN A RADIO

TECHNICAL FIELD

This invention relates generally to radio receivers, and has particular applicability to multiple channel receivers wherein one of the channels comprises a priority communications channel.

BACKGROUND ART

Two way RF transceivers and one way RF receivers are well known in the art. Through use of such devices, a user can receive messages from one or more distant locations. To facilitate such communications, such radios are often equipped to selectively receive more than one channel. So configured, a user can choose to listen and communicate on a variety of channels depending upon his needs at a particular moment in time.

In general, however, at least one of these channels will typically comprise a priority communications channel. High priority messages intended to be heard by the user will ordinarily be transmitted on that priority channel. Since such messages are, by definition, of a priority nature, a need exists for the user to hear such messages when they occur. An obvious problem arises in accomplishing this end result in a multiple channel radio where the user may be communicating on a non-priority channel coincident with transmission of the priority message.

One very simple prior art solution has been to continuously repeat the priority message until an acknowledgment has been received from all pertinent parties. This approach is very wasteful of time and communications spectrum.

Another proposed solution requires multiple receiver radios (as versus multiple channel radios) such that the priority channel can constantly be monitored by one receiver while the user listens to another channel on another receiver. If a priority message occurs, the user will then be assured of receiving it. This solution, of course, requires redundant receiver structure and consequently constitutes a relatively high cost solution.

Another solution has been to periodically monitor the priority channel while listening to the non-priority channel to ascertain whether a carrier is present. Such monitoring can be accomplished in a relatively short time window, which time window can be made short enough (such as, for example, 30 msec or less) to be virtually unnoticeable by the user. Then, if the receiver detects a carrier on the priority channel, the receiver can switch from the non-priority channel to the priority channel to allow reception of the priority message.

In a system dedicated to the use of only one particular group, such a solution constitutes an adequate remedy. Unfortunately, given the paucity of spectral resources as compared to the demand for radio communications, such single group systems are not the rule. Instead, such channels typically host a number of groups. In order to allow such groups to remain in contact only with one another and avoid unnecessary communications to users not in the group in question, various squelch control mechanisms are used. One such mechanism, offered by Motorola, Inc. under the trademarks Digital Private Line (DPL), a subaudible digital word comprised of 23 bits (12 of which are actual information bits and the remainder of which are provided for parity, error correction and the like) are transmitted on the priority channel. The code word so transmitted can be received, decoded, and compared in a receiver against a stored code word or words, such that the receiver can ascertain whether the message associated with that transmitted code word is intended for its reception. If reception is appropriate, the radio will unsquelch and the message will be rendered audible. If the code word does not match one of the stored code words, then the radio will not unsquelch and the user will not be bothered by the message.

Unfortunately, such code words typically take 171 milleseconds or more to transmit in full. Therefore, a full code word cannot be received within the narrow time window constraints of the prior art approach noted above. This being the case, a need has arisen for priority channel scanning for DPL and similar encoded systems, which scanning does not unduly interfere with communications concurrently taking place on a non-priority channel.

SUMMARY OF THE INVENTION

This need and others are substantially met through the method and device for providing priority channel scan in a radio disclosed herein. This invention takes advantage of the fact that a typical DPL code is repetitively asynchronously transmitted. That is, the 23 bits comprising a code word are transmitted repeatedly without benefit of a synchronizing frame or signal. This functions without synchronizing because the code word itself can be properly decoded and matched regardless of where the receiver begins receiving the code word. For example, the receiver can begin with any one of the 23 bits, and consecutively receive and store the immediately following 22 bits. These 23 bits can then be compared against the prestored code word or code words. If no matches occur, the decoder can then shift the 23 bits by one bit and attempt matching again. This process can continue until all 23 combinations have been attempted. By careful selection of the DPL codes themselves, the user can be assured that each DPL code constitutes a unique code in that every one of its 23 possible permutations will be unique unto itself and will not match a code word not properly associated therewith.

This invention momentarily interrupts reception of a non-priority message to allow brief monitoring of the priority channel for a short period of time, typically less than 40 milleseconds. Although this short period of time will not allow reception of the entire code word, it will allow reception of at least a segment of the full code word. By then properly timing subsequent interruptions of the non-priority channel and coincident monitoring of the priority channel, a serially occurring series of bits comprising the full 23 bit code word can be stored and then reconstructed to allow the matching exercise described above.

This approach, of course, requires more time to allow gathering of all the data reflecting the code word than occurs when monitoring the priority channel for the full amount of time required to gather the code word at one time. Nevertheless, in general the full code word can be reconstructed and the matching completed within a period of time that allows the priority channel to be rendered audible in sufficient time to receive most or all of a priority message. At the same time, the interruptions on the non-priority channel are relatively minimal and do not unduly interfere with such communications.

BRIEF DESCRIPTION OF THE DRAWINGS

These and other attributes of the invention will become more clear upon making a thorough review and study of the following description of the best mode for carrying out the invention, particularly when reviewed in conjunction with the drawings, wherein:

FIG. 1 comprises a block diagram depiction of the device;

FIG. 2 comprises a time/data diagram of repetitive transmissions of a DPL code word;

FIG. 3 comprises a block diagram depiction of a code word as reconstructed from its previously received and decoded segments.

BEST MODE FOR CARRYING OUT THE INVENTION

Figure 4:
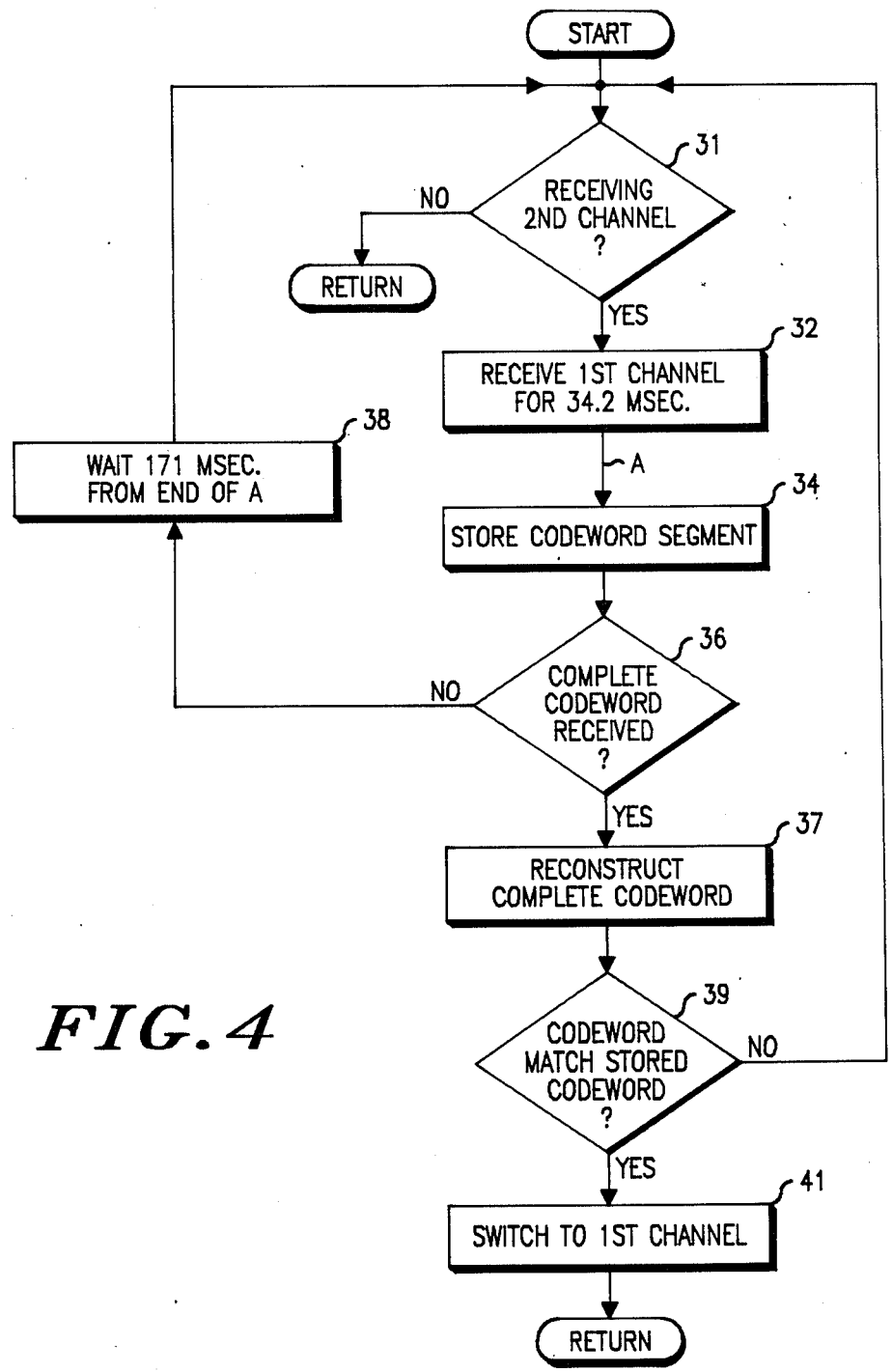
FIG. 4 comprises a flow chart depicting operation of the device.

Referring now to the drawings, and in particular to FIG. 1, the device can be seen as depicted generally by the numeral 10. The device functions in conjunction with a radio receiver having an antenna (11), an RF/IF channel selection unit (12) and an audio circuit (13). This radio further includes a DPL decoding circuit (14), which includes a lowpass filter (16), a data conditioner (17), a code decoder (18), and a code plug (19). The device itself can be embodied through use of a microprocessor (21) having access to a memory (22) and being driven by a clock (23). Each of the above generally referred to components will now be described in more detail in seriatim fashion The antenna (11) receives RF signals and provides these signals to the RF/IF channel selection unit (12) in accordance with well understood prior art technique. The resulting signals are provided to the audio circuit (13) which in turn provides an audio output (24) representative of the audio information contained in the channel being received.

The DPL circuit (14) also receives the output of the RF/IF channel selection unit (12) and lowpass filters (16) this signal (the DPL code word comprising a subaudible component of the information signal). A data conditioner (17) renders this signal into a well formed digital configuration and a code decoder (18) functions in accordance with a code plug (19) to detect and decode the code word, if any.

The microprocessor (21) receives the code word information from the code decoder (18) and functions to store and retrieve such information in and from the memory (22) associated therewith. The microprocessor also receives channel selection information (26) from, for example, a user controllable switch, and also provides channel selection control to the RF/IF channel selection unit (12).

Referring now to FIG. 4, operation of the invention will be described.

Upon determining that the radio is currently receiving a second channel (31) (i.e., a channel other than the priority channel), the radio makes a momentary revision in channel selection and receives the first channel (i.e., the priority channel) for a predetermined period of time (32). In the system depicted, and with reference to FIG. 2, the DPL code words (33) are repetitively transmitted and comprised of 23 bits at a transmission rate of 134.4 Hz, therefore requiring 171 milliseconds for the complete transmission. In the embodiment depicted, the priority channel sample comprises a time duration of 34.2 milleseconds.

Referring again to FIG. 4, the radio then stores (34) the code word segment (33) received during this time window which, with reference to FIG. 2, comprises the code word segment "A". The radio then determines whether the complete code word has been received (36) (FIG. 4). If not, the radio waits a predetermined period of time (38) which in this case comprises 171 milleseconds from the time the radio ceased monitoring the first channel. The radio then returns to the beginning of the flow chart and repeats the priority channel monitoring, such that the code word segment "B" (FIG. 2) is detected and stored, followed by detection and storage of code word segment "C" and so on.

Finally, a sufficient number of code word segments will have been received and stored such that the complete code word can be reconstructed (37) (FIG. 4) as depicted in FIG. 3. The radio can then match the reconstructed code word with one or more stored code words (39) (FIG. 4). If a match occurs, the radio will switch to the priority channel (41) to allow receipt of the priority message. If the complete code word does not match a stored code word, the radio can begin anew with its monitoring task.

Through provision of this invention, monitoring of a non-priority channel can occur substantially unimpeded, as the 34.2 millesecond interruptions every 171 milleseconds will often be nondiscernible to the user. At the same time, the DPL code can typically be successfully detected and decoded in sufficient time to allow reception of all or most of a priority communication, thereby providing priority channel scan in a radio of the type depicted.

Those skilled in the art will recognize that various modifications and changes could be made to the invention without departing from the spirit and scope thereof. It should therefore be understood that the claims are not to be considered as being limited to the precise embodiments set forth in the absence of specific limitations directed to such embodiments.

I claim:

1. Priority channel scan for use in a radio having:
   receiver means for receiving, selectively, at least a first and second channel, wherein said first channel comprises a priority channel;
   code detection means for detecting and decoding a code word received on said first channel;
   said priority channel scan comprising:
   (A) first control means for causing said receiver means, when said receiver means is receiving said second channel, to periodically receive said first channel for a predetermined period of time to allow said code detection means to detect a word segment of said code word if said code word is then being transmitted on said first channel, wherein said predetermined period of time is not adequate to allow said code word to be completely received;
   (B) memory means for storing said word segments as said word segments are periodically received;
   (C) second control means for comparing said word segments, when reconstructed into a complete word, against at least one predetermined code word, and for causing said receiver means to receive said first channel when said complete word matches said at least one predetermined code word.

2. The priority channel scan of claim 1 wherein said predetermined period of time does not exceed 40 milliseconds.

3. The priority channel scan of claim 1 wherein said complete word comprises 23 bits.

4. A method of providing priority channel scan in a radio having:

receiver means for receiving, selectively, at least a first and second channel, wherein said first channel comprises a priority channel; and code detection means for detecting a code word received on said first channel;

wherein said method comprises the steps of:
 (A) when receiving said second channel, momentarily receiving for a first predetermined period of time said first channel, which first predetermined period of time is inadequate to allow reception of a complete code word;
 (B) storing a code word segment as may be received when momentarily receiving said first channel and receiving said second channel again;
 (C) until a sufficient number of code word segments have been consecutively stored, repeating from step (A) following a second predetermined period of time;
 (D) when a sufficient number of code word segments have been consecutively stored, using said code word segments to reconstruct a complete code word;
 (E) comparing said complete code word against at least one stored code word;
 (F) if said complete code word does not match said at least one stored code word, repeating from step (A);
 (G) if said complete code word does match said at least one stored code word, causing said receiver means to receive said first channel to allow reception of a priority message being transmitted thereon.

5. The method of claim 4 wherein said first predetermined period of time does not exceed 40 msec.

6. The method of claim 4 wherein said first predetermined period of time equals 34.2 msec.

7. The method of claim 4 wherein step (G) further includes the step of receiving and decoding said code word as a whole, and of matching said code word against said at least one stored code word prior to rendering said priority message audible.

* * * * *